United States Patent

Kohama et al.

[11] Patent Number: 5,825,227
[45] Date of Patent: Oct. 20, 1998

[54] SWITCHING CIRCUIT AT HIGH FREQUENCY WITH LOW INSERTION LOSS

[75] Inventors: Kazumasa Kohama, Kanagawa; Kazuto Kitakubo, Tokyo, both of Japan

[73] Assignee: Sony Corporation, Japan

[21] Appl. No.: 588,238

[22] Filed: Jan. 18, 1996

[30] Foreign Application Priority Data

Jan. 23, 1995 [JP] Japan ................................ 7-027309

[51] Int. Cl.$^6$ ........................................... H01P 1/22
[52] U.S. Cl. .................. 327/308; 327/427; 327/435; 333/81 R; 333/262
[58] Field of Search .................. 327/308, 318, 327/427, 431, 434–437; 333/101, 103, 262, 81 R

[56] References Cited

U.S. PATENT DOCUMENTS

| 4,430,630 | 2/1984 | Sakamoto . | |
| 4,556,808 | 12/1985 | Coats ........................... | 333/262 |
| 4,789,846 | 12/1988 | Matsunaga et al. . | |
| 4,890,077 | 12/1989 | Sun ............................... | 333/81 |
| 4,931,753 | 6/1990 | Nelson et al. ................ | 333/161 |
| 5,021,758 | 6/1991 | Lane ............................. | 333/262 |
| 5,039,873 | 8/1991 | Sasaki .......................... | 327/237 |
| 5,148,062 | 9/1992 | Goldfarb ...................... | 327/237 |
| 5,191,338 | 3/1993 | Katz et al. ................... | 342/352 |
| 5,485,130 | 1/1996 | Nakahara et al. ............ | 333/262 |

FOREIGN PATENT DOCUMENTS

| 409 374 | 1/1991 | European Pat. Off. . |
| 621 650 | 10/1994 | European Pat. Off. . |
| 625 831 | 11/1994 | European Pat. Off. . |
| 07 303001 | 11/1995 | Japan . |

Primary Examiner—Timothy P. Callahan
Assistant Examiner—T. T. Lam
Attorney, Agent, or Firm—Ronald P. Kananen

[57] ABSTRACT

In a switching circuit, low insertion loss and enough isolation can be ensured at a desired frequency at the same time. An inductor is externally connected in parallel with the path between the drain and source of each of field-effect transistors built in a switching integrated circuit, and the inductor and the OFF capacitance of the field-effect transistor are made to generate parallel resonance. At this time, by suitably adjusting the inductance, low insertion loss and enough isolation are ensured at a desired frequency at the same time.

6 Claims, 8 Drawing Sheets

SWITCHING CIRCUIT AT HIGH FREQUENCY WITH LOW INSERTION LOSS

BACKGROUND OF THE INVENTION

1. Field of the Invention

The present invention relates to a switching circuit, and more particularly to an improvement of a switching circuit which is preferably used for switching an input/output of a high frequency signal.

2. Description of the Related Art

Recently, mobile communication systems such as a mobile telephone system, a pocket telephone, and so on, have been developed as a business on a large scale. On the other hand, shortage of communication circuits is becoming more and more serious in city areas, and various mobile communication systems are coming into practical use in various countries. Not only analog communication systems but also digital communication systems are often adopted as these communication systems, and, as for a communication frequency band, a submicrowave band is used which is on the higher frequency side than that in current mobile communication systems.

Semiconductor field-effect transistors (FET) are often used in a signal processing portion of a portable terminal in such a communication system which transmits and receives signals of a submicrowave band. Particularly, in the case of a portable terminal in which portability is regarded as important, it is regarded as important to develop a monolithic microwave IC (hereinafter abbreviated to 'MMIC') using a GaAs-FET, by which the portable terminal can be made small in size, low in driving voltage and low in power consumption. Particularly, a high-frequency switching device for switching a high-frequency signal in a portable terminal is becoming a key device.

In most mobile communication systems which have come into use, digital systems are adopted as mentioned above. Of those digital systems, a TDMA (Time Division Multiple Access) system is often used. In this TDMA system, a communication band is divided by a predetermined time unit, and the divisional time sections are distributed to transmission, reception and another circuit. In the terminal side, therefore, in order to prevent transmission and reception from being conducted simultaneously, a switching circuit is often used for switching an antenna terminal between a transmission portion (Tx) and a reception portion (Rx).

An example of such a communication terminal device is shown in FIG. 1. When there is much loss of a transmission signal W1 or a reception signal W2 in this switching circuit SW, the quality of the signal deteriorates correspondingly. To avoid this deterioration, it is necessary to increase the signal power correspondingly to the loss. It is therefore preferable to make the loss in the switching circuit SW as small as possible.

In addition, there is a possibility that devices of the reception portion 3 are broken if a transmission signal W1 leaks by a large quantity to the reception side. In addition, if the isolation between the transmission portion 4 and the reception portion 3 is insufficient, signals may be distorted. It is therefore necessary to provide enough isolation between the transmission portion 3 and the reception portion 4. Since superior high-frequency characteristic and high speed switching are thus required of the switching circuit SW, GaAs-FETs are often used as switching devices.

When an FET is used as a switching device, a gate bias which is much higher than a pinch-off voltage of the FET is applied to the gate of the FET so as to make the impedance low between the drain and source to thereby control the FET to be into an ON state. On the contrary, a gate bias which is much lower than the pinch-off voltage of the FET is applied to the gate so as to make the impedance high between the drain and source to thereby control the FET to be into an OFF state.

In the case of a GaAs-FET available on the market recently, the FET can approximate a resistance component connected between the drain and source in an ON state while the FET can approximate a capacitance component connected between the drain and source in an OFF state. Then the resistance value and capacitance value of the FET can be regarded as several [Ω/mm] and several hundred [fF/mm] per gate width (Wg) of the FET, respectively. For example, the resistance $R_{on}$ is 2 [Ω/mm], and the capacitance $C_{off}$ is 300 [fF/mm].

When a submicrowave signal is switched by use of such an FET singly, enough isolation cannot be provided if loss is restrained sufficiently. On the other hand, if enough isolation is ensured, loss is increased. That is, in order to realize a sufficiently small insertion loss, it is necessary to increase the gate width of the FET to some extent so as to reduce the ON-resistance, but on the other hand the capacitance between the drain and source at the time of OFF is increased when the gate width is increased, so that there is a fear that the isolation deteriorates.

Therefore, when a microwave signal is switched, often an FET1 is disposed in a series position with respect to a signal path, and an FET2 is disposed in a shunt position between the signal path and the ground, as shown in FIG. 2A. For example, when a signal band is 2 [GHz], insertion loss of 1 [dB] or less and isolation of 20 [dB] or more can be easily ensured by a switching circuit constituted by a GaAs-FET disposed in such a series position and a GaAs-FET disposed in such a shunt position.

When an FET is disposed in a shunt position as shown in FIG. 2A, the shunt FET is connected to the ground, so that the potential in each of the drain region and the source region of the FET is 0 [V] in DC so long as the FET is not separated in view of DC by a capacitor or the like as shown in FIG. 2B. Generally speaking, in order to turn a GaAs-FET off sufficiently, it is necessary to apply negative gate bias to the drain region and the source region.

Therefore, a negative power supply is required to control the FET. However, if such a switching circuit is used as a terminal of a cellular communication or a portable telephone as mentioned above, the negative power supply needs a DC-DC converter, and so on, disadvantageously in cost, size and power consumption. Therefore, a device using no negative power supply is being performed upon a GaAs monolithic microwave IC (hereinafter abbreviated to 'MMIC') at present.

In the case of this IC, a capacitance is provided between a shunt FET and the ground in a chip, and an FET in a switching circuit is isolated from the ground in view of DC. However, in this case, the capacitance provided for DC cut is considerably large in size in a submicrowave region. It is therefore disadvantageous in producing an inexpensive IC.

In the case of a switching circuit for switching a signal among several places by means of FETs, such as an SPDT (Single Pole Dual Throw) switching circuit, there is a problem that insertion loss cannot be reduced to a certain value or less even if the size of isolation is ignored.

This will be described in an SPDT switching circuit in FIG. 3. For example, the signal path between RF1 and RF2 is in an ON state (that is, an FET1 is in an ON state and an FET2 is in an OFF state), a signal passing the signal path between RF1 and RF2 leaks through an OFF capacitance Cds of the FET2 which is in an OFF state, so that the insertion loss deteriorates.

Therefore, in the case where the gate width of the FET1 is made to be equal to that of the FET2, even if their gate widths are increased to reduce ON resistance of one FET which is in an ON state so as to reduce the signal loss of the FET which is in an ON state, the OFF capacitance Cds of the other FET which is in an OFF state increases to thereby increase the signal leaking from the FET in an OFF state, so that the insertion loss is not reduced beyond a certain value.

Therefore, in the switching circuit for switching a signal among a plurality of directions by use of FETs as shown in FIG. 3 (other than an SPST (Single Pole Single Throw) switching device which is an ON/OFF switch, there is a limit also in reducing insertion loss.

SUMMARY OF THE INVENTION

In view of the foregoing, an object of the present invention is to provide a switching circuit in which a desired-frequency microwave signal can be switched with low insertion loss and with high isolation.

The foregoing object and other objects of the present invention have been achieved by the provision of a switching circuit comprises: a switching integrated circuit including a field-effect transistor having a signal path between a drain and a source, a high-impedance element connected to a gate terminal of the field-effect transistor, and first and second input/output terminals connected to a drain terminal and a source terminal of the field-effect transistor respectively; and an inductor provided outside the switching integrated circuit, and connecting the first and second input/output terminals to each other.

Further, in the present invention, a switching circuit comprises: a switching integrated circuit including first, second and third input/output terminals, a first field-effect transistor having drain and source terminals connected to the first and second input/output terminals respectively, a second field-effect transistor having drain and source terminals connected to the first and third input/output terminals respectively, and first and second high-impedance elements connected to gate terminals of the first and second field-effect transistors respectively; and first and second inductors provided outside the switching integrated circuit, and connecting the first and second input/output terminals to each other, and the first and third input/output terminals to each other.

Further, in the present invention, a switching circuit comprises: a switching integrated circuit including first, second, third and fourth input/output terminals, a first field-effect transistor having drain and source terminals connected to the first and second input/output terminals respectively, a second field-effect transistor having drain and source terminals connected to the second and third input/output terminals respectively, a third field-effect transistor having drain and source terminals connected to the third and fourth input/output terminals respectively, a fourth field-effect transistor having drain and source terminals connected to the fourth and first input/output terminals respectively, and first, second, third and fourth high-impedance elements connected to gate terminals of the first, second, third and fourth field-effect transistors respectively; and first, second, third and fourth inductors provided outside the switching integrated circuit, and connecting the first and second input/output terminals to each other, the second and third input/output terminals to each other, the third and fourth input/output terminals to each other, and the fourth and first input/output terminals to each other respectively.

Even when the gate width of a field-effect transistor is increased to make loss insertion low, parallel resonance at a desired frequency is produced by the inductor externally connected in parallel with the path between the drain and source of the field-effect transistor and the OFF capacitance of the field-effect transistor, so that sufficient isolation can be ensured.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings:

(1) First Embodiment (1-1) Basic Configuration

Figure 4:
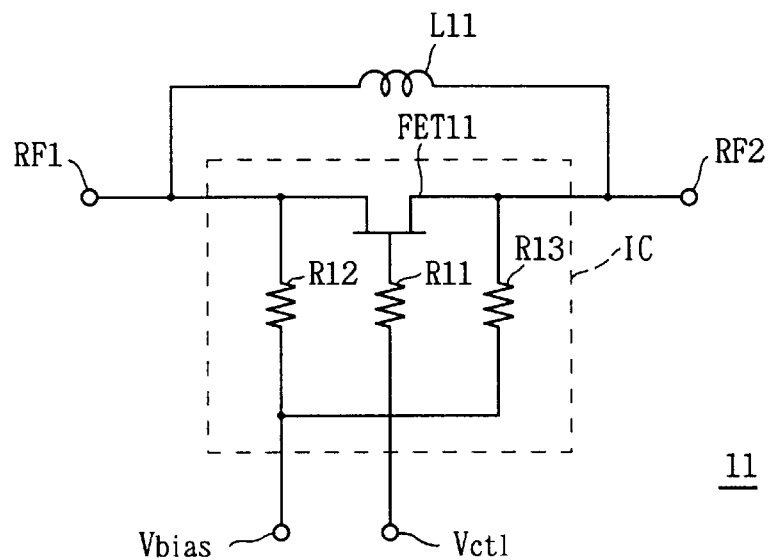
FIG. 4 is a connection diagram illustrating an embodiment of an SPST switching circuit according to the present invention.

FIG. 4 shows an SPST (Single Pole Single Throw) switching circuit 11. This SPST switching circuit 11 is constituted by an integrated circuit (IC) and an inductor L11 connected in parallel with a signal line in the integrated circuit (IC). This switching circuit has a feature in that the inductor L11 is attached outside the integrated circuit.

The integrated circuit (IC) is constituted by a GaAs junction FET FET11 disposed at a in series position with the signal path, a resistance R11 connected to a gate terminal of the FET11, and bias resistors R12 and R13 connected to a drain terminal and a source terminal of the FET11, respectively.

The drain terminal and source terminal of the FET11, the gate bias resistor R11 and the bias resistors R12 and R13 are connected to terminals RF1, RF2, $V_{ct1}$ and $V_{bias}$ all of which are provided outside the IC.

By only an FET, it is generally difficult to provide superior insertion loss and isolation at the same time.

In the case of the SPST switching circuit 11, however, since the inductor L11 is externally attached in parallel with the path between the drain and source, parallel resonance can be produced at a desired frequency between the OFF capacitance $C_{off}$ existing between the drain and source of the FET and the inductance of the externally attached inductor L11 even if the gate width of the FET is increased to make the insertion loss low. Accordingly, it is understood that sufficient isolation can be ensured while keeping low insertion loss if the SPST switching circuit 11 is used.

Figure 2A:
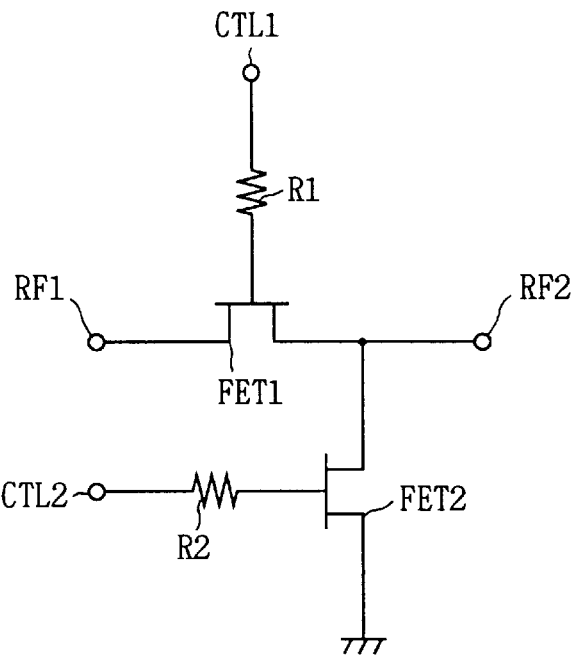
FIGS. 2A and 2B are connection diagrams illustrating the configuration of a conventional switching circuit.
Figure 2B:
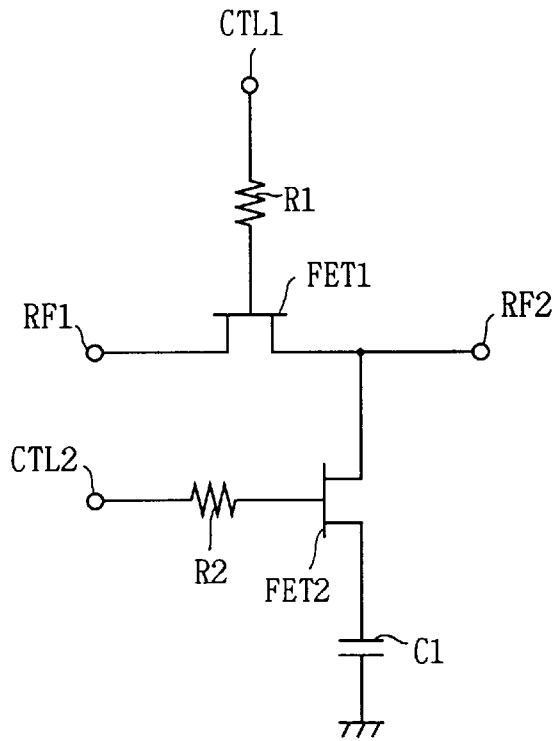

In addition, in the case of the SPST switching circuit 11, in comparison with such a switching circuit (FIG. 2B) in which a capacitor is provided between a shunt FET and the ground, the chip size can be reduced by the areas to be occupied by the shunt FET and the capacitor. Accordingly, it is possible to reduce the cost of manufacture.

In addition, because the inductor L11 is attached outside the IC chip, the inductance can be selected in accordance with a desired frequency and the property of general use can be also improved.

Further, it can be considered to provide the inductor L11 inside the IC chip. In the case of attaching the inductor L11 outside the IC chip, however, the chip size can be reduced by the area of the inductor L11 in comparison with the case of providing the inductor L11 inside the IC chip, and the cost can be therefore reduced correspondingly.

In addition, because of employing such an IC structure, the switching circuit can be made small in size and low in cost in comparison with the case where an equivalent circuit is constituted by discrete parts. Further, in this case, because the configuration of bias lines and so on is simple, it is easy to improve the performance.

(1-2) Application Example

Figure 5:
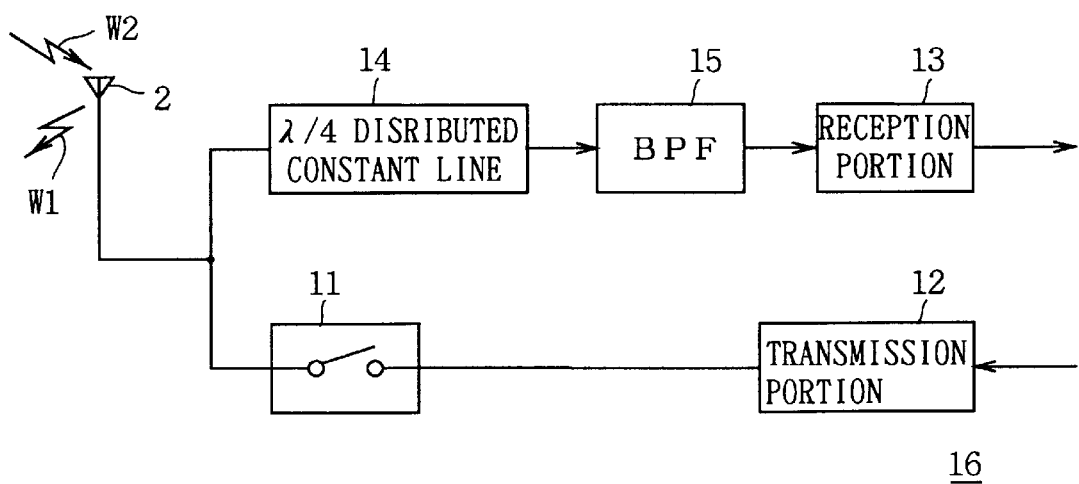
FIG. 5 is a block diagram illustrating a communication terminal apparatus using the SPST switching circuit according to the present invention.

Next, FIG. 5 shows a circuit configuration where this SPST switching circuit 11 is applied to an antenna switching circuit for use in a TDMA communication system. In this example, the SPST switching circuit 11 the transmission frequency of which is a resonance frequency is disposed between an antenna 2 and a transmission portion 12. In addition, a distributed constant line 14 of ¼ wavelength of the transmission frequency and a band pass filter 15 of reception frequency are disposed between the antenna 2 and a reception portion 13.

In the thus configured circuit, control can be made so that enough isolation with respect to the transmission frequency can be obtained between the antenna 2 and the reception portion 13 while signals of the reception frequency can be passed therebetween.

In the above configuration, the operation of transmission and reception of a communication terminal device 16 will be described. First, at the time of transmission, the SPST switching circuit 11 is turned ON. Since enough isolation with respect to the transmission frequency is ensured between the antenna 2 and the reception portion 13 at this time, the antenna 2 is connected to the transmission portion 12.

At the time of reception, on the contrary, the SPST switching circuit 11 is turned OFF. Since enough isolation with respect to the reception frequency is ensured between the antenna 2 and the transmission portion 12 at this time, the path between the antenna 2 and the reception portion 13 is conductive so that the antenna 2 is connected to the reception portion 13.

When the SPST switching circuit 11 is used in a TDMA communication switching circuit in this manner, it is possible to obtain such a communication terminal device 16 in which the antenna 2 can be switched between the transmission and reception portions alternatively while low insertion loss and high isolation are realized, and which is superior in talking property, small in size and low in cost.

(2) Second Embodiment (2-1) Basic Configuration

Figure 6:
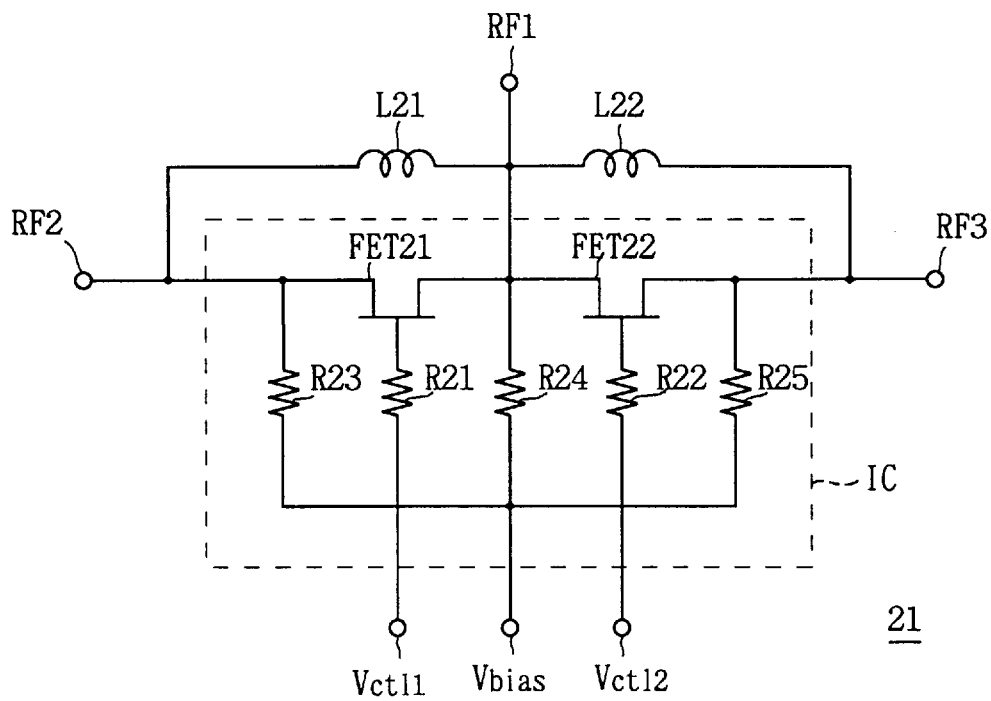
FIG. 6 is a connection diagram illustrating an embodiment of an SPDT switching circuit according to the present invention.

Next, FIG. 6 shows an SPDT (Single Pole Dual Throw) switching circuit 21 arranged according to the same principle as that in the first embodiment.

Also in this SPDT switching circuit 21, the OFF capacitances $C_{off}$ between the drain and source of a GaAs junction FET21 and the drain and source of an FET22 in an IC chip, and the inductances of inductors L21 and L22 attached outside the IC chip are made to generate parallel resonance so as to ensure low insertion loss and isolation sufficiently.

Figure 1:
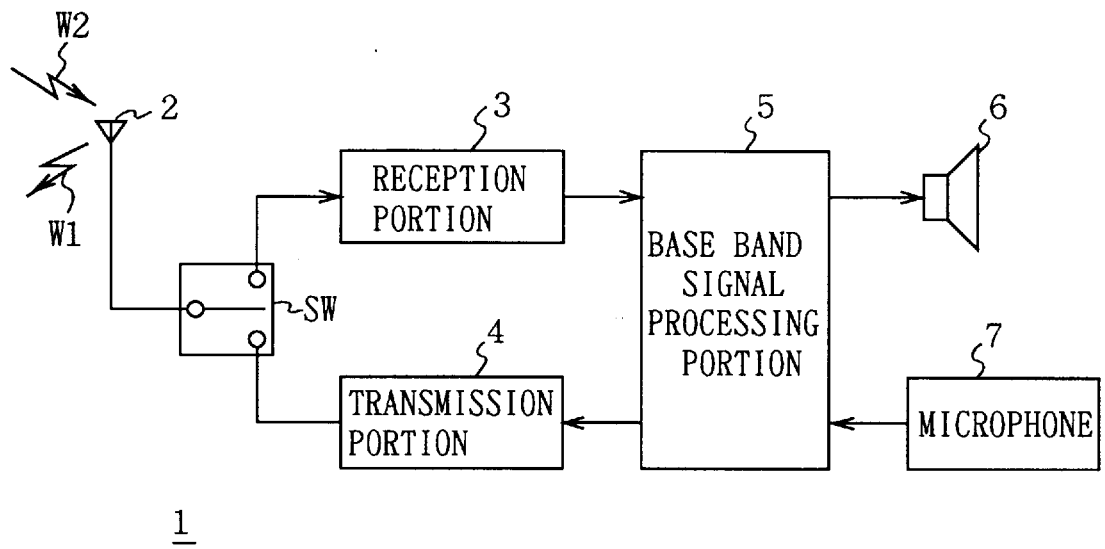
FIG. 1 is a block diagram explaining a communication terminal device.
Figure 3:
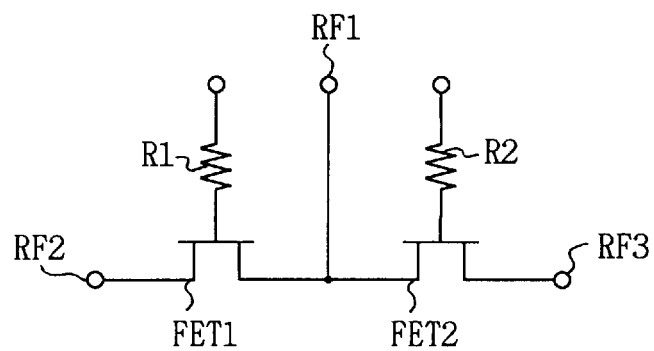
FIG. 3 is a connection diagram illustrating a conventional configuration of an SPDT switching circuit.

In addition, there is a limit in such a circuit as shown in FIG. 3 even if isolation is ignored to reduce insertion loss. In the circuit shown in FIG. 6, however, the isolation of signal lines in an OFF state can be ensured ideally by the externally attached inductors L21 and L22 even if the gate width of the FETs is enlarged (that is, signals can be restrained from leaking from the signal lines), so that lower insertion loss than that of the circuit shown in FIG. 3 can be realized.

(2-2) Application Example

Figure 7:
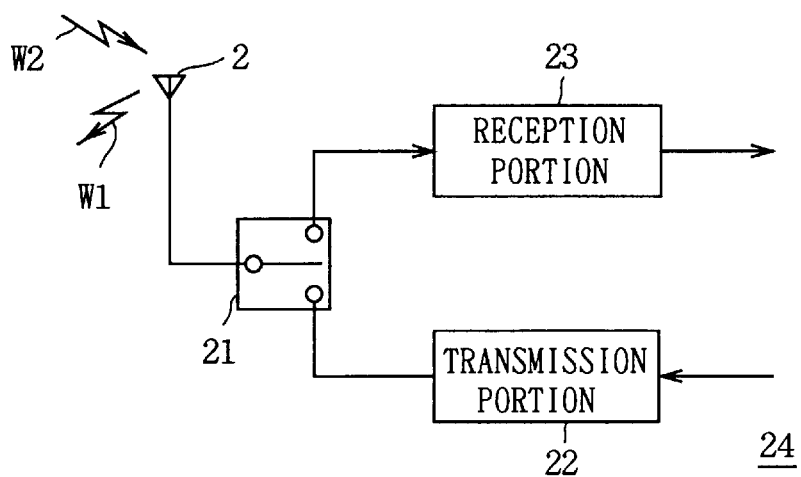
FIG. 7 is a block diagram illustrating a communication terminal apparatus using the SPDT switching circuit according to the present invention.

Next, FIG. 7 shows a circuit configuration where the thus configured SPDT switching circuit 21 is applied to an antenna switching circuit for a TDMA communication system.

When the SPDT switching circuit 21 is used for a TDMA communication switching circuit in such a manner, it is possible to obtain a communication terminal device 24 in which an antenna 2 can be switched between transmission and reception portions alternatively while low insertion loss and high isolation are realized, and which is superior in talking property, small in size and low in cost.

(3) Third Embodiment (3-1) Basic Configuration

Figure 8:
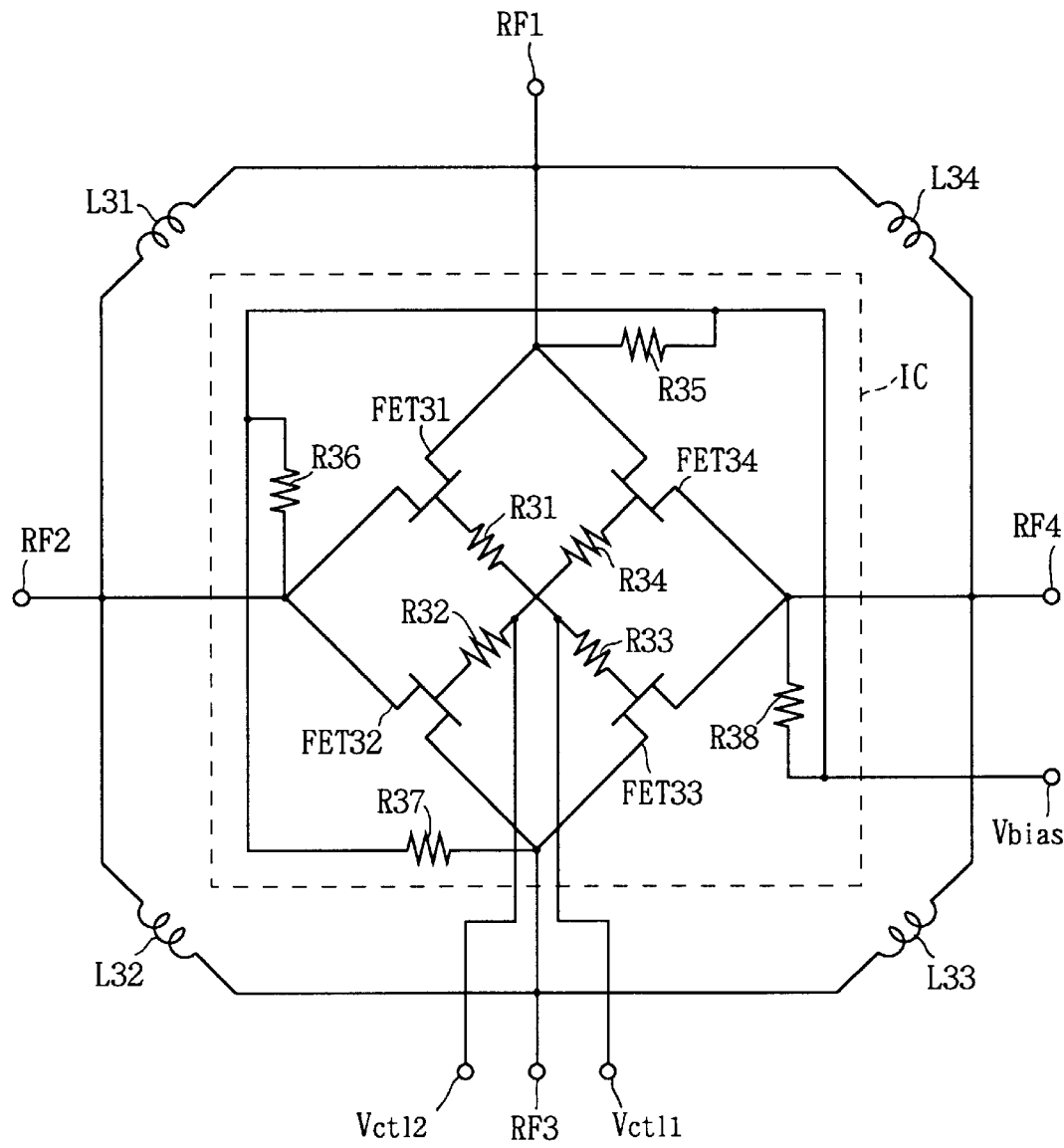
FIG. 8 is a connection diagram illustrating an embodiment of a DPDT switching circuit according to the present invention.

Finally, a DPDT (Dual Pole Dual Throw) switching circuit 31 configured in accordance with the same principle as that in the first embodiment is shown in FIG. 8.

Also in this DPDT switching circuit 31, the OFF capacitances $C_{off}$ between the drain and source of GaAs junction FETs FET31 to FET34 in an IC and inductors L31 to L34 attached outside are made to resonate in parallel, so as to ensure low insertion loss and isolation sufficiently.

In addition, in the circuit where a plurality of signal lines (two, in this case) are connected to another signal line, insertion loss can be effectively prevented from deteriorating in comparison with the case of FIG. 6. That is, when parallel resonance is not used, the number of FETs which are in an OFF state is increased (because parasitic capacitance causing signals to leak is increased), so that the deterioration of the insertion loss is larger than that in FIG. 6. Therefore, if parallel resonance is used, there is ideally no signal leakage from the FETs which are in an OFF state, so that it is possible to obtain insertion loss equivalent to that of an SPST switching circuit.

(3-2) Application Example

Figure 9:
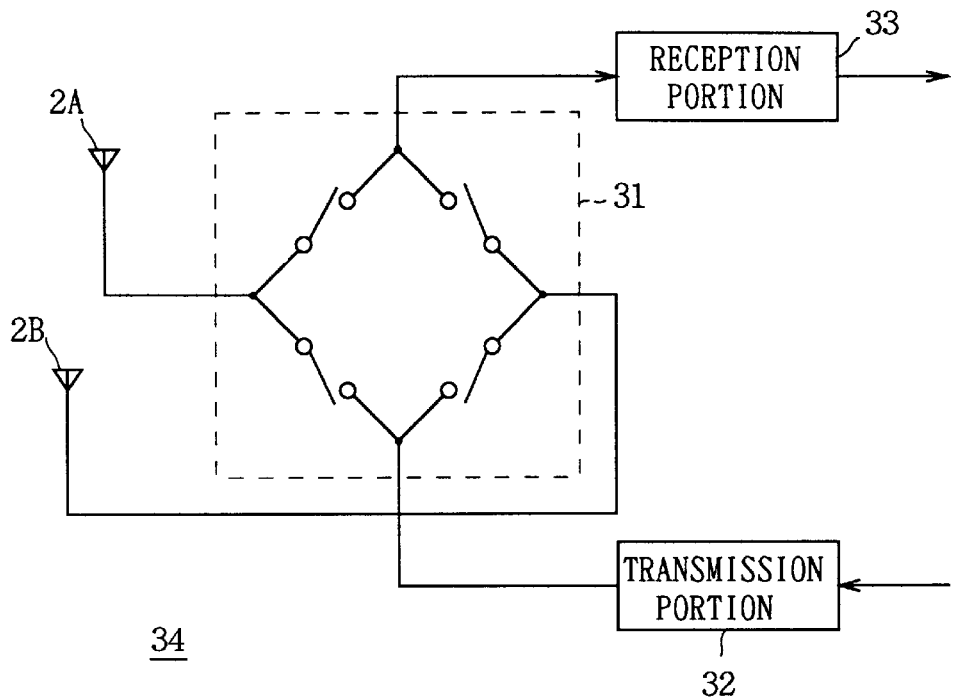
FIG. 9 is a block diagram illustrating a communication terminal apparatus using the DPDT switching circuit according to the present invention.

Next, FIG. 9 shows a circuit configuration where the thus configured DPDT switching circuit 31 is applied to an antenna switching circuit for a TDMA communication system. In this example, an inside antenna 2A and an outside antenna 2B are provided in a terminal, and each of the antennae is switched between a transmission portion 32 and a reception portion 33.

When the DPDT switching circuit 31 is used for a TDMA communication switching circuit in this manner, it is possible to obtain such a communication terminal device 34 in which each of the antennae 2A and 2B can be switched between the transmission and reception portions while low insertion loss and high isolation are realized, and which is superior in talking property, small in size and low in cost.

Figure 10:
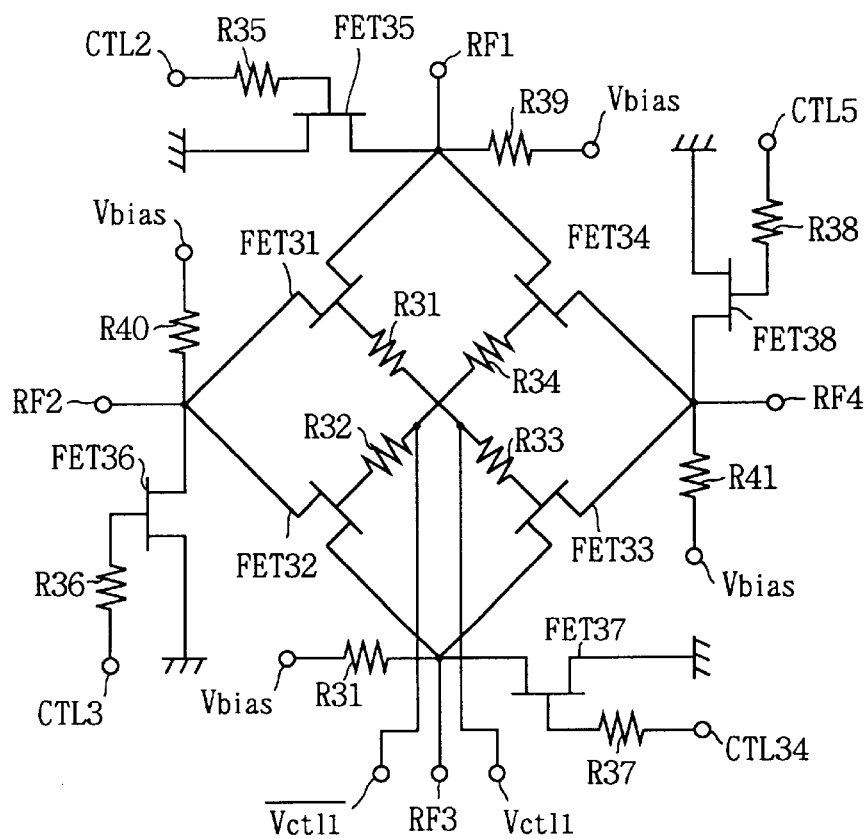
FIG. 10 is a connection diagram illustrating an embodiment of a DPDT switching circuit to which a shunt FET is attached.
Figure 11:
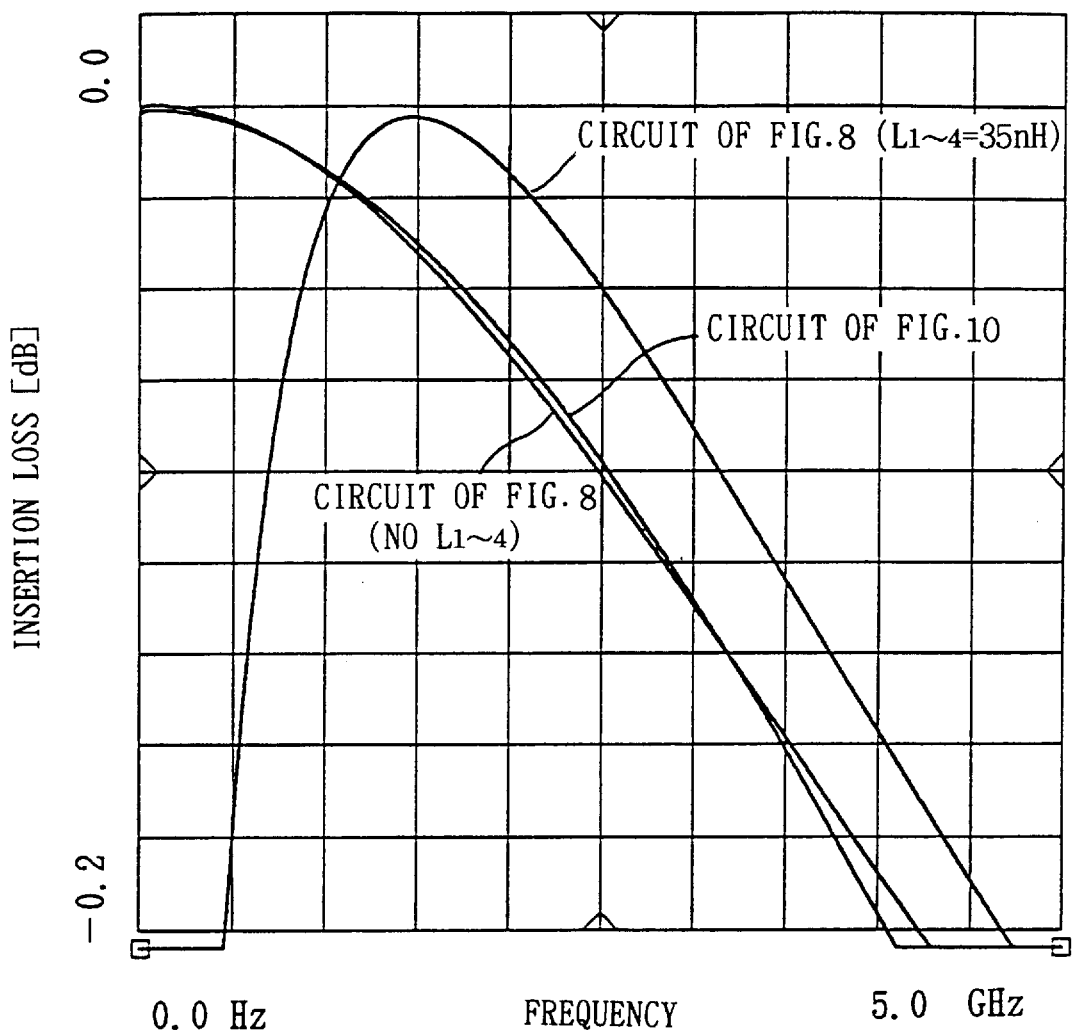
FIG. 11 is a characteristic curvilinear diagram showing the frequency dependency of the insertion loss.
Figure 12:
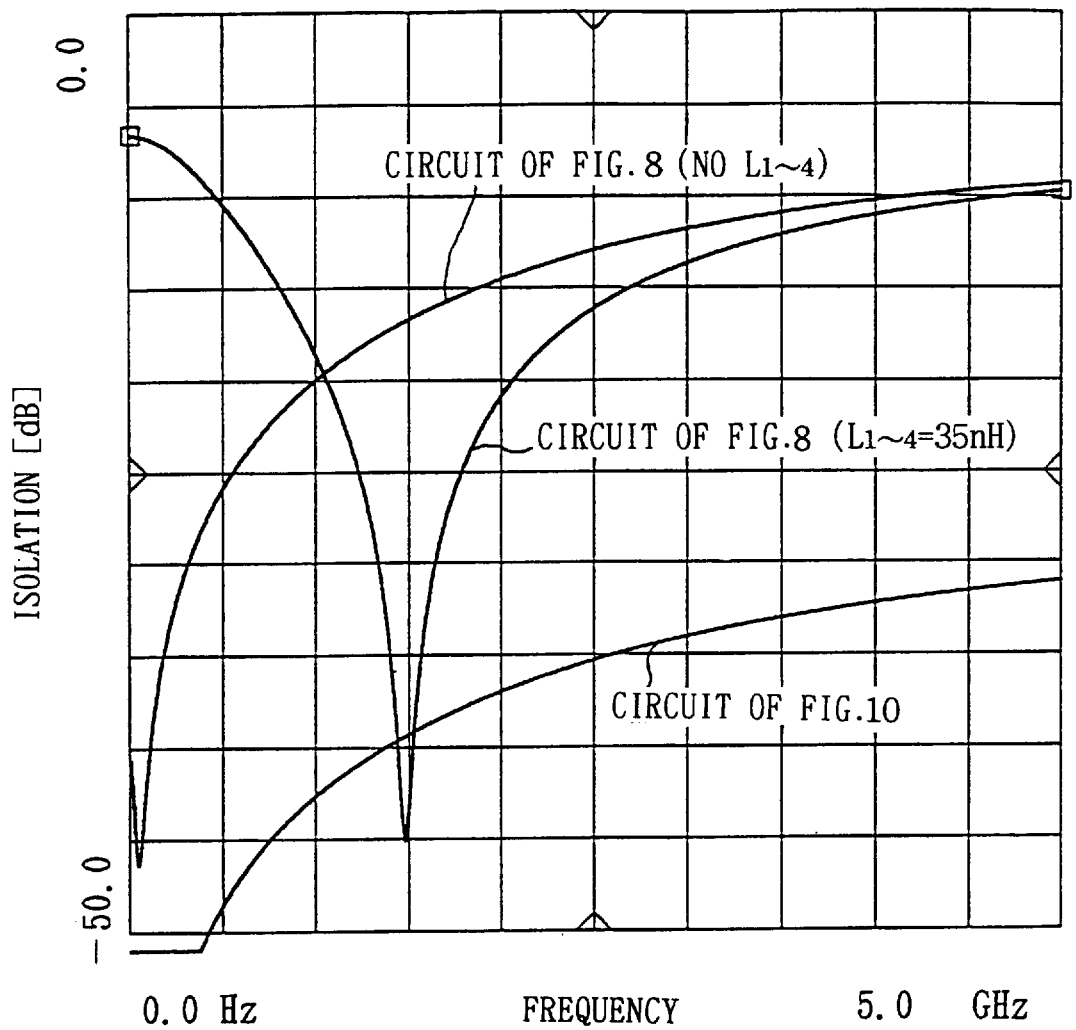
FIG. 12 is a characteristic curvilinear diagram showing the frequency dependency of the isolation.

Next, actual examples of the effects of the communication terminal device 34 are shown. FIG. 10 is a circuit diagram of a switching circuit where isolation is ensured by use of a shunt FET. FIGS. 11 and 12 show the simulation results of the frequency characteristic of the insertion loss and isolation in each of three cases, a first and a second one of which are the cases where externally attached inductors for resonance are used and not used in the circuit shown in FIG. 8 respectively, and a third one of which is the case where such a shunt FET as shown in FIG. 10 is used.

The inductance of the resonance inductors L31 to L34 is set to 35 [nH] so as to have a resonance point at 1.5 [GHz]. Each of the FET31 to FET38 is constituted by a GaAs junction FET having a gate width of 1 [mm], a gate length of 0.5 [$\mu$m], and a pinch-off voltage of –0.5 [V]. The gate control voltage of these FET31 to FET38 is such that the on-bias voltage is 4 [V], the off-bias voltage is 0 [V], and the bias $V_{bias}$ is 3 [V].

As seen from FIG. 11, the insertion loss in the case of FIG. 8 using the resonance inductors is superior centering 1.5 [GHz] to the case of using no inductor. Further, also as for the isolation, as shown in FIG. 12, the isolation is greatly improved in the case of using resonance inductors, and performance equivalent to or beyond that in the system of using a shunt FET is exhibited in the vicinity of 1.5 [GHz].

(4) Other Embodiments

In the above embodiments, the drain and source terminals of the field-effect transistor, in which the path between the drain and source thereof is made to be a signal path, are directly connected to the input/output terminals. However, the present invention is not limited to this but can be applied to the case where high impedance elements for application of a DC bias are connected to the drain and source terminals. The high impedance elements may be provided inside the IC chip or provided at a part or all outside the IC chip.

This technique may be applied to the case of an SPST switching circuit, the case of an SPDP switching circuit, and the case of a DPDT switching circuit.

The above technique may be applied, not only to the cases mentioned above, but also to the case where any one of or any combination of the FET switching control terminals, the FET drain and source biasing terminals, and the DC/RF grounding terminals is provided in the IC chip.

Further, in the case of the SPDT switching circuit in the above embodiments, the inductors L21 and L22 are externally provided outside the IC chip even between the input/output terminals RF1 and RF2 and between the RF1 and RF3. However, the present invention is not limited to this but an inductor may be connected between the input/output terminals RF2 and RF3.

Further, in the above embodiments, single-gate FETs are used. However, the present invention is not limited to this but multi-gate FETs, such as dual-gate FETs may be used.

Further, in the above embodiments, one stage of FET is connected between every input and output terminals. However, the present invention is not limited to this but can be applied to the case where a plurality of stages of FETs are connected in series.

In the above embodiments, junction FETs are used. However, the present invention is not limited to this but can be applied to the case of using MESFETs.

As has been described above, according to the present invention, an inductor is connected outside in parallel with the path between the drain and source of each of the field-effect transistors built in a switching integrated circuit, and the inductor and the OFF capacitance of the field-effect transistor are made to generate parallel resonation, so that it is possible to realize a switching circuit in which low insertion loss and sufficient isolation can be ensured at a desired frequency at the same time.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A switching circuit comprising:

first, second and third input/output terminals, a first field-effect transistor having drain and source terminals connected to said first and second input/output terminals respectively, a second field-effect transistor having drain and source terminals connected to said first and third input/output terminals respectively, and first and second impedance elements connected to gate terminals of said first and second field-effect transistors respectively; and first and second inductors connecting said first and second input/output terminals to each other and said first and third input/output terminals to each other respectively; and a third, fourth and fifth impedance elements connected between a bias voltage source and said first, second and third input/output terminals respectively.

2. The switching circuit according to claim 1, wherein said first and second field-effect transistors and said first and second impedance elements are formed as an integrated circuit and said first and second inductors are provided outside said integrated circuit.

3. The switching circuit according to claim 1, further comprising first and second control signals supplied to said gate terminals of said first and second transistors through said first and second impedance elements respectively.

4. The switching circuit according to claim 3, wherein said first and second inductors each have an inductance which is selected in response to a frequency of said first or second control voltage signal respectively.

5. The switching circuit according to claim 1, wherein one or more field-effect transistors are connected in series between one of said first and second field-effect transistors and one of said input/output terminals.

6. The switching circuit according to claim 1, wherein said first and second field-effect transistors are junction field-effect transistors.

* * * * *